(12) United States Patent
So et al.

(10) Patent No.: US 7,176,493 B2
(45) Date of Patent: Feb. 13, 2007

(54) ACTIVE MATRIX DISPLAY DEVICE AND MANUFACTURING METHOD THEREOF

(75) Inventors: Woo Young So, Suwon (KR); Kyung Jin Yoo, Suwon (KR); Sang Il Park, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/736,703

(22) Filed: Dec. 17, 2003

(65) Prior Publication Data

US 2004/0124417 A1 Jul. 1, 2004

Related U.S. Application Data

(62) Division of application No. 10/077,771, filed on Feb. 20, 2002, now Pat. No. 6,692,997.

(30) Foreign Application Priority Data

Mar. 2, 2001 (KR) .............................. 2001-010840

(51) Int. Cl.
*H01L 21/84* (2006.01)
(52) U.S. Cl. ........................... 257/72; 257/59; 257/347
(58) Field of Classification Search .................. 257/59, 257/72, 347, 749; 349/139
See application file for complete search history.

(56) References Cited

U.S. PATENT DOCUMENTS

| | | | |
|---|---|---|---|
| 5,648,277 A | 7/1997 | Zhang et al. | ................ 438/151 |
| 5,663,077 A | 9/1997 | Adachi et al. | ............... 438/151 |
| 5,834,328 A | 11/1998 | Jang | .............................. 438/30 |
| 5,895,692 A * | 4/1999 | Shirasaki et al. | ............ 427/557 |
| 6,323,051 B1 * | 11/2001 | Shimada | ....................... 438/30 |
| 6,348,367 B1 | 2/2002 | Ohtani et al. | ................ 438/151 |
| 6,395,586 B1 | 5/2002 | Huang et al. | ................ 438/149 |
| 6,468,839 B2 | 10/2002 | Inoue et al. | .................. 438/149 |
| 6,489,176 B2 | 12/2002 | Ninomiya | ..................... 438/30 |
| 6,503,772 B1 | 1/2003 | Ohtsu et al. | ................... 438/30 |
| 2003/0027405 A1 | 2/2003 | Hayashi | ...................... 438/458 |
| 2003/0119230 A1 | 6/2003 | Chida et al. | ................. 438/149 |
| 2003/0138998 A1 | 7/2003 | Yamazaki et al. | ........... 438/155 |

* cited by examiner

*Primary Examiner*—N. Drew Richards
(74) *Attorney, Agent, or Firm*—H.C. Park & Associates, PLC (57) ABSTRACT

The present invention discloses a method of manufacturing an active matrix display device, comprising: a) forming a semiconductor layer on an insulating substrate; b) forming a gate insulating layer over the whole surface of the substrate while convering the semiconductor layer; c) forming a gate electrode on the gate insulating layer over the semiconductor layer; d) forming spacers on both side wall portions of the gate electrode while exposing both end portions of the semiconductor layer; e) ion-implaing a high-density impurity into the semiconductor layer to form high-density source and drain regions in the semiconductor layer; f) depositing sequentially a transparent conductive layer and a metal layer on the inter insulating layer; g) patterning the transparent conductive layer and the metal layer to form the source and drain electrodes, the source and drain electrodes directly contacting the high-density source and drain regions and having a dual-layered structure; h) forming a passivation layer over the whole surface of the substrate; i) etching the passivation layer and the metal layer to form an opening portion exposing a portions of the transparent conductive layer, thereby forming a pixel electrode; and j) performing a reflow process to cover the metal layer in the opening portion by the passivation layer.

4 Claims, 9 Drawing Sheets

ACTIVE MATRIX DISPLAY DEVICE AND MANUFACTURING METHOD THEREOF

This application is a divisional application of and claims priority to U.S. patent application Ser. No. 10/077,771, filed Feb. 20, 2002, now U.S. Pat. No. 6,692,997, which is incorporated herein in its entirety.

CROSS REFERENCE

This application claims the benefit of Korean Patent Application No. 2001-10840, filed on Mar. 2, 2001, under 35 U.S.C. § 119, the entirety of which is hereby incorporated by reference.

BACKGROUND OF THE INVENTION

1. Field of the Invention

The present invention relates to a thin film transistor, and more particularly, to a method of manufacturing the same. Also, the present invention relates to an active matrix display device having improved reliability and a manufacturing method is thereof.

2. Description of Related Art

A cathode ray tube (CRT) is widely employed as display devices for use in televisions, measuring instruments, information terminals, etc. However, the CTR has disadvantages that it cannot satisfy trends toward miniaturization and lightweight of electronic appliances.

Due to such shortcomings of the CRT, flat panel display devices, which are lightweight and small-sized, is being watched with keen interest.

Figure 1:
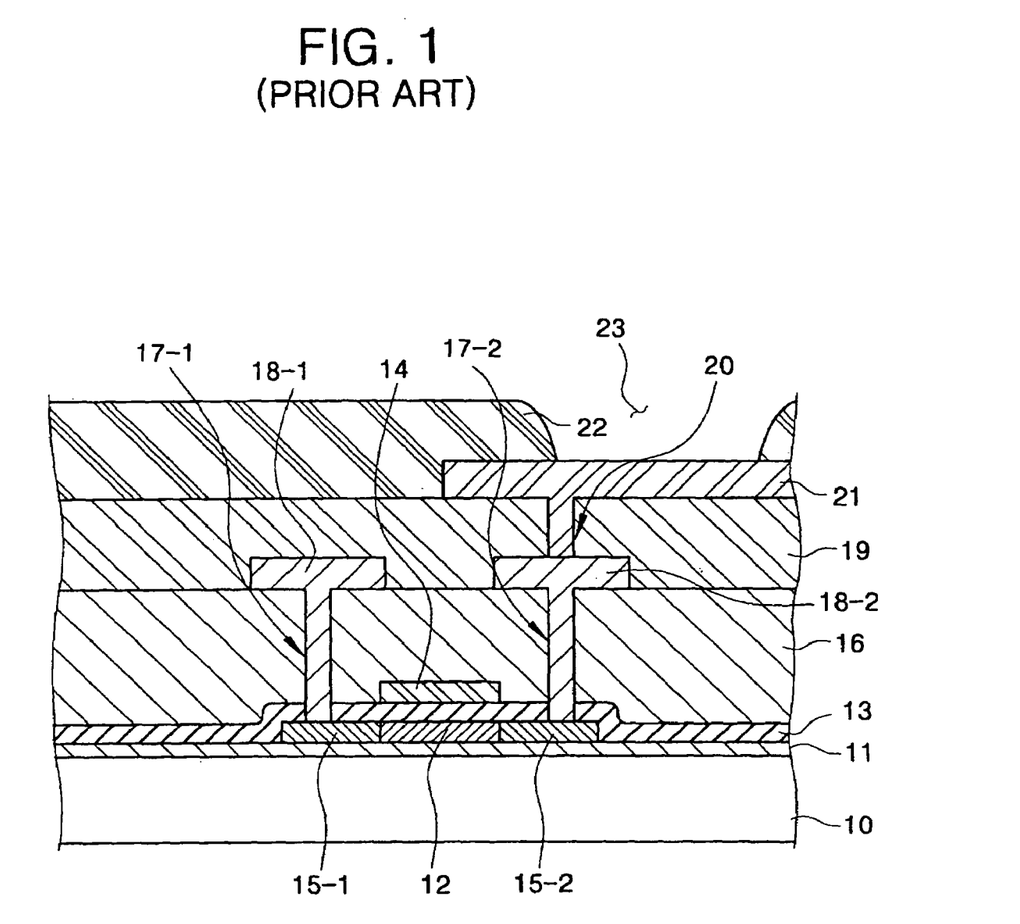
FIG. 1 is a cross-sectional view illustrating a thin film transistor (TFT) of an active matrix flat panel display device according to a conventional art.

FIG. 1 is a cross-sectional view illustrating a TFT array substrate of an active matrix flat panel display device according to a conventional art. A process of manufacturing the conventional TFT array substrate is described below.

First, a buffer layer 11 is formed on a transparent substrate 10. The buffer layer 11 is an oxide layer, and the substrate is a transparent glass substrate or a transparent plastic substrate. A polycrystalline silicon layer is deposited on the buffer layer 11 and then patterned to form a semiconductor layer 12.

Then, a first insulating layer 13 is deposited over the whole surface of the substrate 10 and covers the semiconductor layer 12. The first insulating layer 13 serves as a gate insulating layer. A first metal layer is deposited on the first insulating layer 13 and then patterned to form a gate electrode 14 over the semiconductor layer 12. A high-density impurity, for example, an n-type or a p-type high-density impurity is ion-implanted into the semiconductor layer 12 to form high-density source and drain regions 15-1 and 15-2 on both end portions of the semiconductor layer 12.

Thereafter, a second insulating layer 16 is deposited over the whole surface of the substrate 10 and then patterned to form first and second contact holes 17-1 and 17-2. The first contact hole 17-1 is formed at a location corresponding to a portion of the source region 15-1, and the second contact hole 17-2 is formed at a location corresponding to a portion of the drain region 15-2. The second insulating layer 16 serves as an inter insulating layer.

Subsequently, a second metal layer is deposited on the inter insulating layer 16 and then patterned to form source and drain electrodes 18-1 and 18-2. The source and drain electrodes 18-1 and 18-2 contact the source and drain regions 15-1 and 15-2 through the first and second contact holes 17-1 and 17-2, respectively.

Next, a passivation layer 19 is formed over the whole surface of the substrate 10 and covers the source and drain electrodes 18-1 and 18-2. The passivation layer 19 includes a via hole 20 at a location corresponding to a portion of either of the source and drain electrodes 18-1 and 18-2. In FIG. 1, the via hole 20 is formed on a portion of the drain electrode 18-2.

A transparent conductive material layer is deposited and then patterned to form a pixel electrode 21. The pixel electrode 21 contacts the drain electrode 18-2 through the via hole 20.

Finally, a planarization layer 22 is deposited and then patterned to form an opening portion 23. The opening portion 23 exposes a portion of the pixel electrode 21. Therefore, the TFT array substrate of the flat panel display device is completed.

The source and drain electrodes 18-1 and 18-2 are electrodes to which electrical signals are applied and are made of a low resistive metal to prevent a signal delay. The pixel electrode 21 is made of a low resistive, high transmitting material, for example, a transparent conductive material such as indium tin oxide (ITO).

Therefore, when the source and drain electrodes and the pixel electrode are made of metal, they are low in specific resistance but low in transmittance. Alternatively, when the source and drain electrodes and the pixel electrode are made of ITO, they are high in transmittance but high in specific resistance in comparison to metal. Neither of metal and ITO cannot satisfy requirements of the source and drain electrodes and the pixel electrode.

Therefore, in conventional manufacturing process of the TFT array substrate of the flat panel display device, the source and drain electrodes are made of metal, and the pixel electrode is made of ITO. As a result, two mask processes are required to form the source and drain electrodes and the pixel electrode. In addition, a process is additionally required that forms the contact hole in the passivation layer to contact one of the source and drain electrodes and the pixel electrode.

As described above, the conventional process of manufacturing the TFT array substrate of the flat panel display device is very complicated. Therefore, manufacturing yield is low, and production cost is high.

Also, the TFT array substrate of the flat panel display device has a problem in that a contact resistance between the source and drain regions and the source and drain electrodes is very large sufficiently to degrade electric characteristics thereof.

SUMMARY OF THE INVENTION

To overcome the problems described above, preferred embodiments of the present invention provide a thin film transistor and a flat panel display device having an improved light transmittance and a low resistance.

It is another object of the present invention to provide a thin film transistor and a flat panel display device having a simplified manufacturing process, leading to manufacturing yield and high production cost.

It is a still object of the present invention to provides a thin film transistor and a flat panel display device having excellent electric characteristics.

In order to achieve the above object, the preferred embodiments of the present invention provide a method of manufacturing an active matrix display device, comprising:
a) forming a semiconductor layer on an insulating substrate;
b) forming a gate insulating layer over the whole surface of the substrate while covering the semiconductor layer; c) forming a gate electrode on the gate insulating layer over the semiconductor layer; d) ion-implanting a high-density impurity into the semiconductor layer to form high-density source and drain regions in the semiconductor layer; e) forming an inter insulating layer over the whole surface of the substrate; f) etching the inter insulating layer to form contact holes, the contact holes exposing portions of the high-density source and drain regions; g) depositing sequentially a transparent conductive layer and a metal layer on the inter insulating layer; h) patterning the transparent conductive layer and the metal layer to form the source and drain electrodes, the source and drain electrodes contacting the high-density source and drain regions through the contact holes and having a dual-layered structure; i) forming a passivation layer over the whole surface of the substrate; j) etching the passivation layer and the metal layer to form an opening portion exposing a portions of the transparent conductive layer, thereby forming a pixel electrode; and k) performing a reflow process to cover the metal layer in the opening portion by the passivation layer.

The present invention further provides a method of manufacturing an active matrix display device having an opening portion, comprising: a) forming a semiconductor layer on an insulating substrate; b) forming a gate insulating layer over the whole surface of the substrate while covering the semiconductor layer; c) forming a gate electrode on the gate insulating layer over the semiconductor layer; d) ion-implanting a high-density impurity into the exposed portions of the semiconductor layers to form high-density source and drain regions; e) forming an inter insulating layer over the whole surface of the substrate, f) etching the inter insulating layer including to form contact holes exposing portions of the high-density source and drain regions; g) depositing sequentially a transparent conductive layer and a metal layer over the whole surface of the substrate; h) coating a photoresist layer over the whole surface of the substrate; i) patterning the photoresist layer using a half-tone mask to from a photoresist pattern, the photoresist pattern exposing a portion of the metal layer over the gate electrode and including a relative thin portion having a thickness thinner than the rest portion thereof at a location thereof corresponding to the opening portion; j) patterning the transparent conductive layer and the metal layer using the photoresist pattern as a mask to form source and drain electrodes and to expose a portion of the transparent conductive layer corresponding to the opening portion, the source and drain electrodes respectively contacting the high-density source and drain regions through the contact holes and having a dual-layered structure; and k) depositing a passivation layer over the whole surface of the substrate and etching the passivation layer to form the opening portion, thereby forming a pixel electrode.

The present invention further provides a method of manufacturing an active matrix display device, comprising: a) forming a semiconductor layer on an insulating substrate; b) forming a gate insulating layer over the whole surface of the substrate while covering the semiconductor layer; c) forming a gate electrode on the gate insulating layer over the semiconductor layer; d) forming spacers on both side wall portions of the gate electrode while exposing both end portions of the semiconductor layer; e) ion-implanting a high-density impurity into the semiconductor layer to form high-density source and drain regions in the semiconductor layer; f) depositing sequentially a transparent conductive layer and a metal layer on the inter insulating layer; g) patterning the transparent conductive layer and the metal layer to form the source and drain electrodes, the source and drain electrodes directly contacting the high-density source and drain regions and having a dual-layered structure; h) forming a passivation layer over the whole surface of the substrate; i) etching the passivation layer and the metal layer to form an opening portion exposing a portions of the transparent conductive layer, thereby forming a pixel electrode; and j) performing a reflow process to cover the metal layer in the opening portion by the passivation layer.

The present invention further provides a method of manufacturing an active matrix display device having an opening portion, comprising: a) forming a semiconductor layer on an insulating substrate; b) forming a gate insulating layer over the whole surface of the substrate while covering the semiconductor layer; c) forming a gate electrode on the gate insulating layer over the semiconductor layer; d) forming spacers on both side wall portions of the gate electrode while exposing both end portions of the semiconductor layer; e) ion-implanting a high-density impurity into the exposed portions of the semiconductor layer to form high-density source and drain regions; f) depositing sequentially a transparent conductive layer and a metal layer over the whole surface of the substrate; g) coating a photoresist layer over the whole surface of the substrate; h) patterning the photoresist layer using a half-tone mask to from a photoresist pattern, the photoresist pattern exposing a portion of the metal layer over the gate electrode and including a relative thin portion having a thickness thinner than the rest portion thereof at a location thereof corresponding to the opening portion; i) patterning the transparent conductive layer and the metal layer using the photoresist pattern as a mask to form source and drain electrodes and to expose a portion of the transparent conductive layer corresponding to the opening portion, the source and drain electrodes respectively directly contacting the high-density source and drain regions and having a dual-layered structure; and j) depositing a passivation layer over the whole surface of the substrate and etching the passivation layer to form the opening portion, thereby forming a pixel electrode.

The present invention further provides an active matrix display device, comprising: a semiconductor layer formed on an insulating substrate; a gate insulating layer formed over the whole surface of the substrate and exposing both end portions of the semiconductor layer; a gate electrode formed on the gate insulating layer over the semiconductor layer; spacers formed on both side wall portions of the gate electrode; source and drain regions formed in the exposed portions of the semiconductor layer that are not covered by the spacers; source and drain electrodes directly contacting the high-density source and drain regions and having a dual-layered structure of a transparent conductive layer and a metal layer; a passivation layer formed over the whole surface of the substrate to cover the metal layer for the source and drain electrodes and having an opening portion; and a pixel electrode extending from a portion of the transparent conductive layer forming any one of the source and drain electrodes and exposed by the opening portion.

The present invention further provides an active matrix display device, comprising: a semiconductor layer formed on an insulating substrate; a gate insulating layer formed over the whole surface of the substrate and covering the semiconductor layer; a gate electrode formed on the gate insulating layer over the semiconductor layer; high-density source and drain regions formed on both end portions of the semiconductor layer; an inter insulating layer formed over the whole surface of the substrate and having contact holes, the contact holes exposing portions of the source and drain regions; source and drain electrodes formed on the inter insulating layer, contacting the high-density source and drain regions through the contact holes and having a dual-layered structure of a transparent conductive layer and a metal layer; a passivation layer formed over the whole surface of the substrate to cover the metal layer for the source and drain electrodes and having an opening portion; and a pixel electrode extending from a portion of the transparent conductive layer forming any one of the source and drain electrodes and exposed by the opening portion.

The source and drain electrodes comprises a transparent conductive layer and a metal layer in sequentially stacked. The metal layer is made of a material having a lower specific resistance than the transparent conductive layer or one of Al, Al-alloy, Mo, Mo-alloy, Cr, and Ti. The transparent conductive layer is made of one of indium tin oxide, indium zinc oxide, tin oxide and indium oxide.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, example of which is illustrated in the accompanying drawings.

FIGS. 2A to 2E are cross-sectional views illustrating a thin film transistor (TFT) according to a first preferred embodiment of the present invention.

Figure 2A:
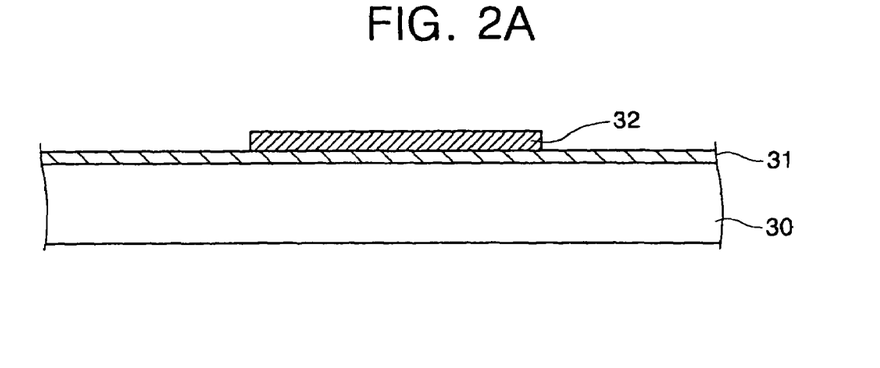
FIGS. 2A to 2E are cross-sectional views illustrating a thin film transistor (TFT) according to a first preferred embodiment of the present invention.

First, as shown in FIG. 2A, a buffer layer 31 is formed on a transparent substrate 30. The buffer layer 31 is an oxide layer, and the substrate is a transparent glass substrate or a transparent plastic substrate. A polycrystalline silicon layer is deposited on the buffer layer 31 and then patterned to form a semiconductor layer 32.

Figure 2B:
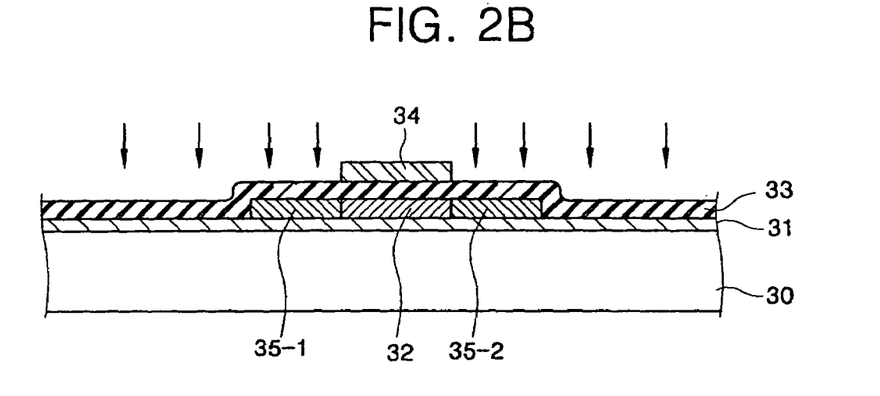

Then, as shown in FIG. 2B, a first insulating layer 33 is deposited over the whole surface of the substrate 30 and covers the semiconductor layer 32. The first insulating layer 33 serves as a gate insulating layer. A first metal layer is deposited on the first insulating layer 33 and then patterned to form a gate electrode 34 over the semiconductor layer 32. A high-density impurity, for example, an n-type or a p-type high-density impurity is ion-implanted into the semiconductor layer 11 to form high-density source and drain regions 35-1 and 35-2 on both end portions of the semiconductor layer 32.

Figure 2C:
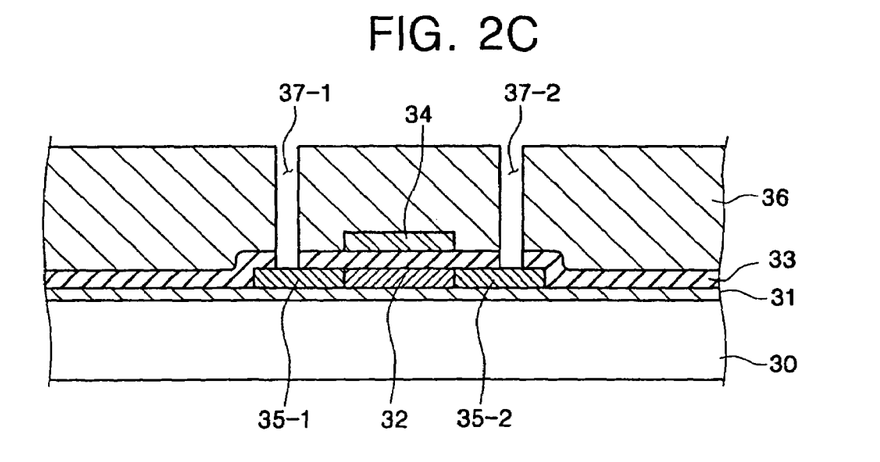

Thereafter, as shown in FIG. 2C, a second insulating layer 36 is deposited over the whole surface of the substrate 30 and then patterned to form first and second contact holes 37-1 and 37-2. The first contact hole 37-1 is formed at a location corresponding to a portion of the source region 35-1, and the second contact hole 37-2 is formed at a location corresponding to a portion of the drain region 35-2. The second insulating layer 36 serves as an inter insulating layer.

Figure 2D:
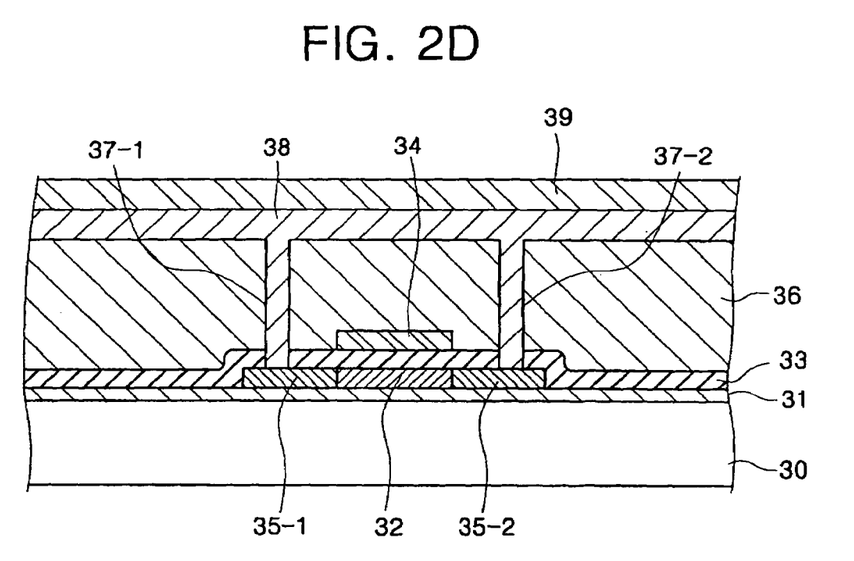
Figure 2E:
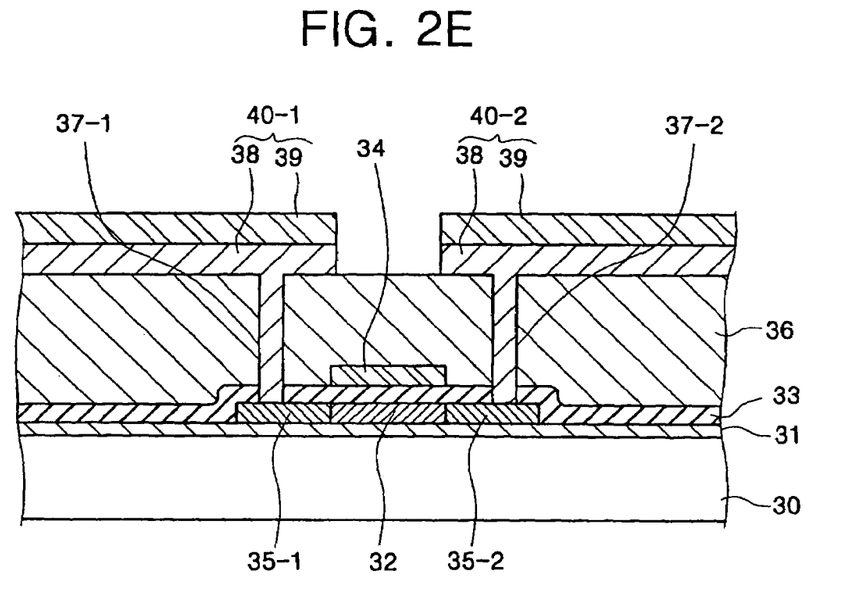

Subsequently, as shown in FIG. 2D, a transparent conductive material layer 38 and a second metal layer 39 are sequentially deposited on the inter insulating layer 36. The second metal layer 39 is made of a material having a resistance value lower than the transparent conductive material layer such as Al, Al-alloy, Mo, Mo-alloy, Cr, and Ti. The transparent conductive material layer 39 is made of a material such as indium tin oxide (ITO), indium zinc oxide (IZO), tin oxide (TO) and indium oxide (10). The second metal layer 39 and the transparent conductive material layer 38 are patterned to form source and drain electrodes 40-1 and 40-2. Therefore, the source and drain electrodes 40-1 and 40-2 have a dual-layered structure. The dual-layered source and drain electrodes 40-1 and 40-2 contact the source and drain regions 35-1 and 35-2 through the first and second contact holes 37-1 and 37-2, respectively. Therefore, the TFT is completed.

In the process of manufacturing the TFT according to the first preferred embodiment of the present invention, the source and drain regions 35-1 and 35-2 are configured to have a single doped region but can have an offset region or a lightly doped drain (LDD) region by, for example, an anodizing process. That is, the first preferred embodiment of the present invention can be applied to the TFT of the offset structure or the LDD structure having dual-layered source and drain electrodes.

FIGS. 3A to 3F are cross-sectional views illustrating a process of manufacturing a TFT according to a second preferred embodiment of the present invention.

Figure 3A:
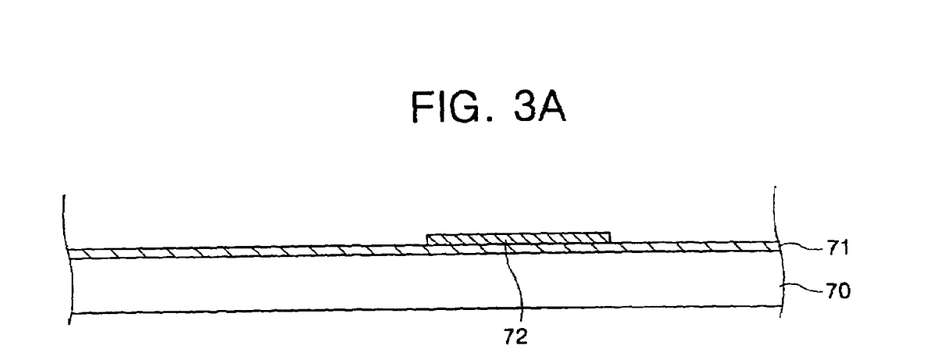
FIGS. 3A to 3F are cross-sectional views illustrating a process of manufacturing a TFT according to a second preferred embodiment of the present invention.

First, as shown in FIG. 3A, a buffer layer 71 is formed on an insulating layer 70, and a semiconductor layer 72 is formed on the buffer layer 71.

Figure 3B:
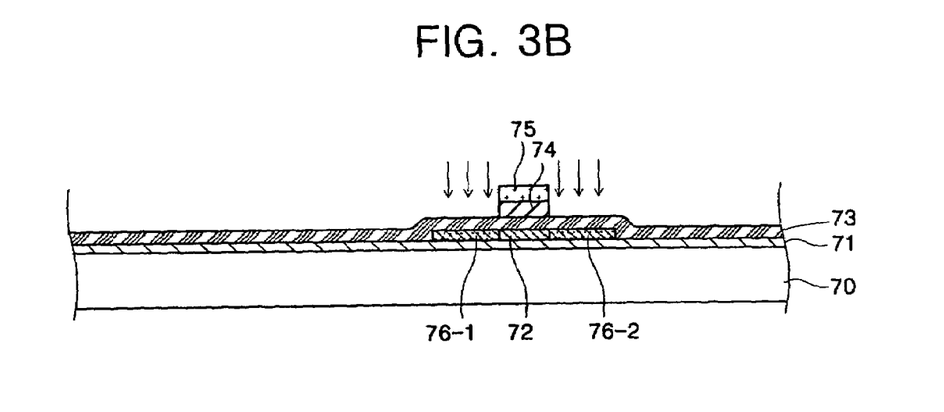

As shown in FIG. 3B, a first insulating layer 73 is formed over the whole surface of the substrate 70 and covers the semiconductor layer 72. An oxide layer or a nitride layer is used as the first insulating layer 73. A first metal layer and a second insulating layer are sequentially deposited on the first insulating layer 73 and then patterned to form a gate electrode 74 and a capping layer 75 over the semiconductor layer 72. Thereafter, using the gate electrode 74 as a mask, an n-type or a p-type low-density impurity is ion-implanted into both end portions of the semiconductor layer 72 to form low-density source and drain regions 76-1 and 76-2. At this moment, the capping layer 75 serves as an impurity barrier to prevent the gate electrode 74 from being ion-implanted and includes SiNx or $SiO_2$.

Figure 3C:
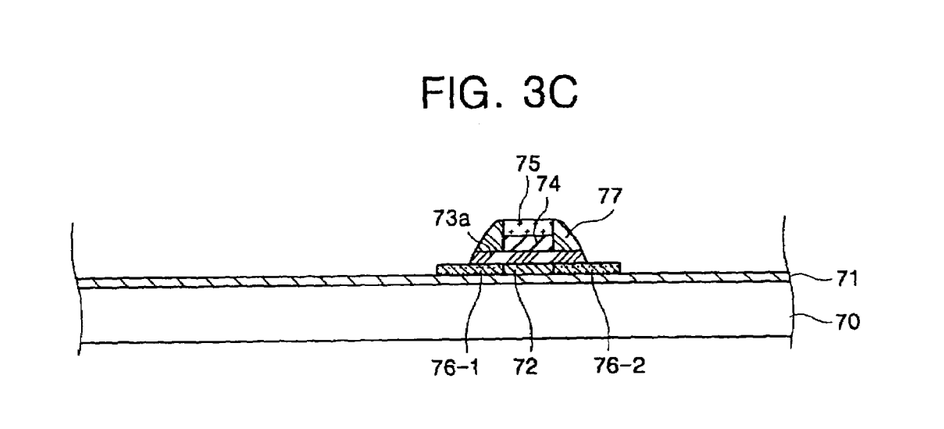

Subsequently, as shown in FIG. 3C, a third insulating layer is deposited over the whole surface of the substrate 70 and then etched-back to form spacers 77 on both side wall portions of the gate electrode 74 and the capping layer 75, so that the gate electrode 74 is perfectly insulated by the capping layer 75 and the spacers 77. An oxide layer or a nitride layer is used as the third insulating layer. At the same time, the third insulating layer 73 is etched to form a gate insulating layer 73a, so that end portions of the low-density source and drain regions 76-1 and 76-2 are exposed.

Figure 3D:
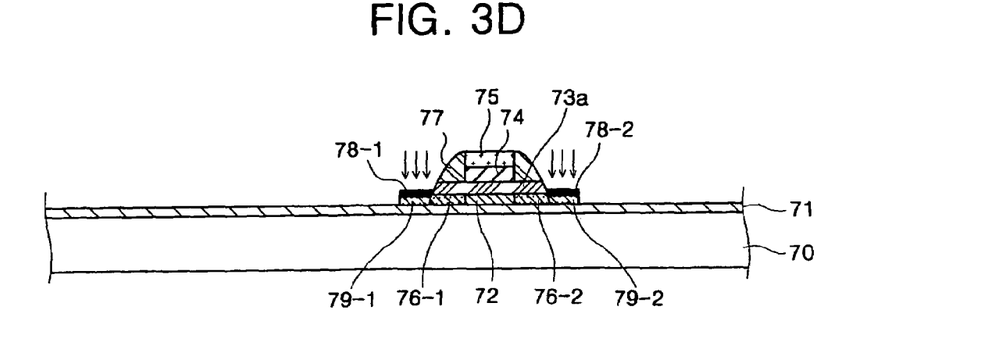

Next, as shown in FIG. 3D, silicide layers 78-1 are formed on the exposed portions of the source and drain regions 76-1 and 76-2, respectively. Subsequently, a high-density impurity having the same conductivity as the source and drain regions 76-1 and the 76-2 is ion-implanted into the exposed low-density source and drain regions 76-1 and 76-2 to form high-density source and drain regions 79-1 and 79-2.

Figure 3E:
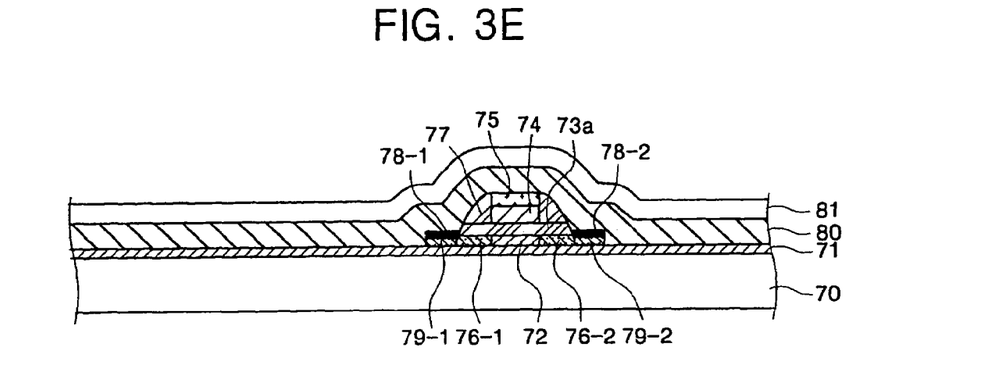
Figure 3F:
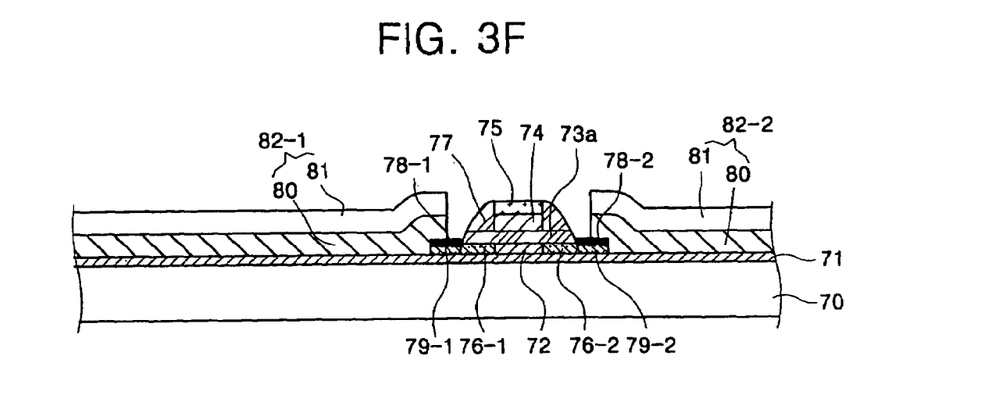

Finally, as shown in FIGS. 3E and 3F, a transparent conductive material layer and a second metal layer 80 and 81 are sequentially deposited over the whole surface of the substrate 70 and then patterned to form source and drain electrodes 82-1 and 82-2. The source and drain electrodes 82-1 and 82-2 have a dual-layered structure. The second metal layer 81 is made of a material having a lower resistance value than the transparent conductive material layer 80 such as Al, Al-alloy, Mo, Mo-alloy, Cr, and Ti, and the transparent conductive material layer 80 is made of a transparent conductive material such as ITO, IZO, TO, and IO. Therefore, the TFT according to the second preferred embodiment of the present invention is completed.

According to the second preferred embodiment of the present invention, since the source and drain regions are formed in a self-align manner using the spacers, an additional mask process to form an LDD structure is not required. Also, since the source and drain electrodes 82-1 and 82-2 directly contact the high-density source and drain regions 79-1 and 79-2 without contact holes, one mask process can be omitted, leading to a simplified manufacturing process. In addition, since the silicide layers 78-1 and 78-2 are, respectively, formed between the source and drain regions 79-1 and 79-2 and the source and drain electrodes 82-1 and 82-2, a contact resistance can be reduced. Furthermore, the silicide layers 78-1 and 78-2 serves as an etching barrier for source and drain electrodes 82-1 and 82-2 to improve an etching selection ratio, and also serves as an impurity barrier during an ion-implanting process for the high-density source and drain regions 79-1 and 79-2 to minimize damages of the semiconductor layer 72.

The TFT according to the second preferred embodiment of the present invention has an LDD structure or an off-set structure, electric characteristics can be improved. For example, since an off current is reduced, an on/off current ratio can be improved.

In the first to second preferred embodiments,of the present invention, when the TFT having the source and drain electrodes of a dual-layered structure is applied to the active matrix flat panel display device, the source and drain electrodes come to have a low specific resistance and also improve transmittance of light. Also, since the source and drain electrodes and the pixel electrode are formed through a single mask process, maximum two mask processes are reduced, leading to a simplified manufacturing process.

FIGS. 4A to 4G are cross-sectional views a process of manufacturing an active matrix flat panel display device according to one embodiment of the present invention.

A process of manufacturing an active matrix flat panel display device according to one embodiment of the present invention is explained in detail with reference to FIGS. 4A to 4G.

Figure 4A:
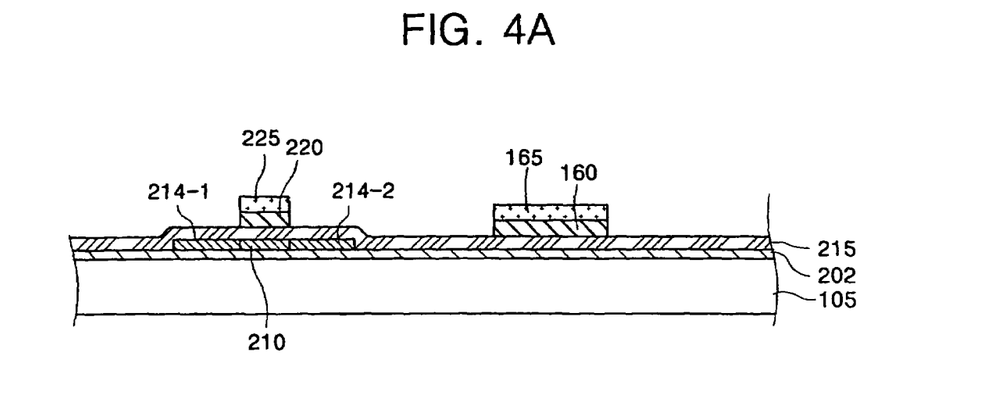
FIGS. 4A to 4G are cross-sectional views illustrating a process of manufacturing an active matrix flat panel display device according to one embodiment of the present invention.
Figure 4B:
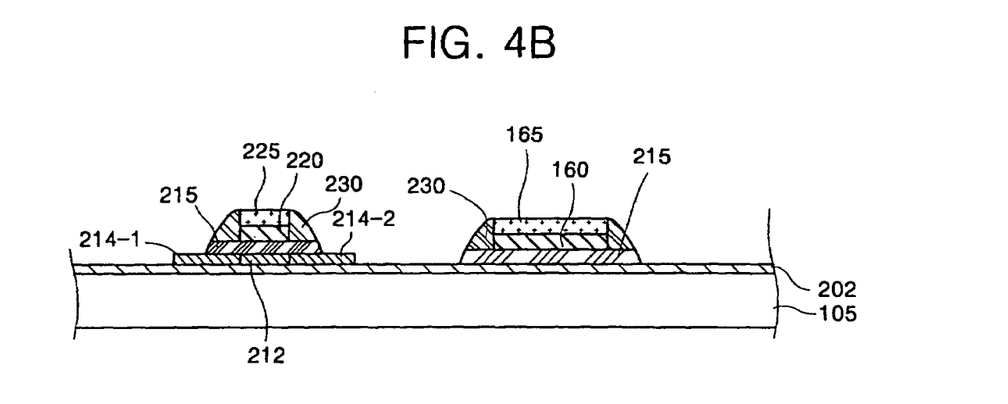

First, as shown in FIGS. 4A and 4B, a buffer layer 202 is formed on a transparent insulating substrate 105. An oxide layer is used as the buffer layer 202. A polycrystalline silicon layer is deposited on the buffer layer 202 and then patterned to form a semiconductor layer 210.

A first insulating layer 215 is formed over the whole surface of the substrate 105. The first insulating layer 215 serves as a gate insulating layer. A first metal layer and a second insulating layer are sequentially deposited on the first insulating layer 215. An oxide layer or a nitride layer is used as the second insulating layer. The first metal layer and the second insulating layer are patterned to form a gate electrode 220 and a capping layer 225 of the TFT 200 over the semiconductor layer 210, and a lower capacitor electrode 160 and a dielectric layer 165 of the storage capacitor 150.

Then, an n-type or a p-type low-density impurity is ion-implanted into both end portions of the semiconductor layer 210 which is not covered with the gate electrode 220 to form low-density source and drain regions 214-1 and 214-2.

Thereafter, a third insulating layer is deposited over the whole surface of the substrate 105 and then etched-back to form spacers 230 on both side wall portions of the gate electrode 220 and the lower capacitor electrode 160.

At the same time, the first insulating layer 215 is etched to form a gate insulating layer 215, so that portions of the source and drain regions 214-1 and 214-2 that are not covered with the gate insulating layer 215 are exposed.

Figure 4C:
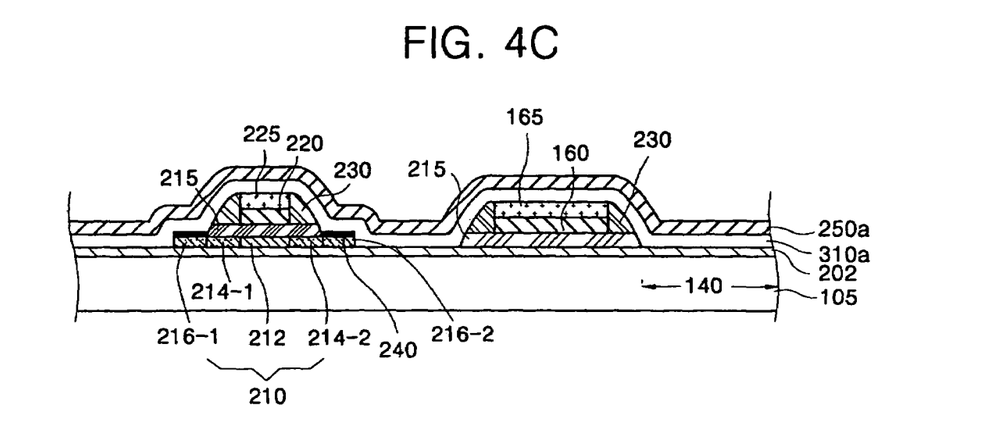

Subsequently, as shown in FIG. 4C, a second metal layer is deposited over the whole surface of the substrate. The second metal layer is made of a material such as In or Cr. The second metal layer is annealed at a low temperature of less than 500□, so that the second metal layer reacts with silicon to form silicide layers 240 such as a In-silicide layer or a Cr-silicide layer on the exposed portions of the low-density source and drain regions 214-1 and 214-2.

After the rest portion of the second metal layer that does not reacts with the silicon is removed, a high-density impurity having the same conductivity as the low-density source and drain regions 214-1 and 214-2 is ion-implanted into both end portions of the low-density source and drain regions 214-1 and 214-2 under the silicide layers 240 to form high-density source and drain regions 216-1 and 216-2. Therefore, the source and drain regions of an LDD structure having both the low-density source and drain regions 214-1 and 214-2 and the high-density source and drain regions 216-1 and 216-2 are formed. A central portion of the semiconductor layer 210 under the gate electrode 220 acts as an active area (i.e., channel area).

Meanwhile, if a process of forming the low-density source and drain regions 214-1 and 214-2 is omitted after forming the gate electrode 22 and thereafter the high-density source and drain regions 216-1 and 216-2 are formed, portions of the semiconductor layer 210 under the spacers 230 which is not ion-implanted with impurity serve as an off-set region, so that the source and drain regions having an off-set structure can be formed.

Subsequently, the transparent conductive material layer 310a and the third metal layer 250a are sequentially deposited over the whole surface 105.

Figure 4D:
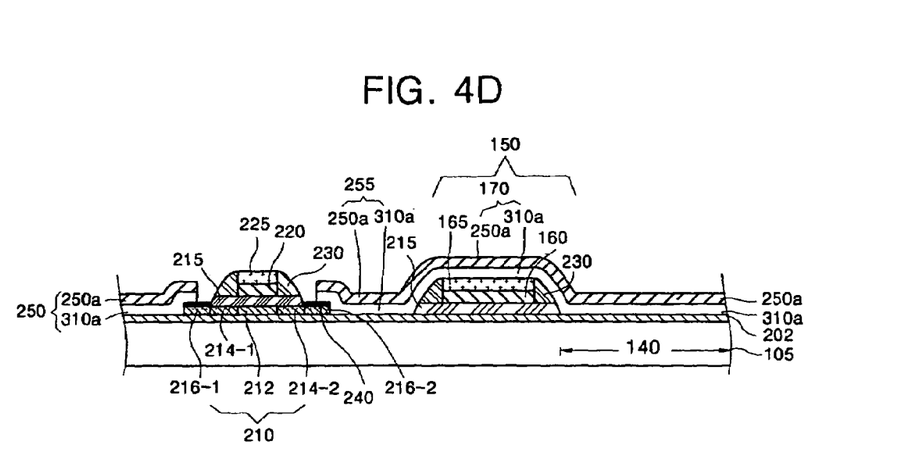

As shown in FIG. 4D, the transparent conductive material layer 310a and the third metal layer 250a are then patterned to form source and drain electrodes 250 and 255 which directly contact the high-density source and drain regions 216-1 and 216-2. The source and drain electrodes 250 and 255 therefore have a dual-layered structure. The transparent conductive material layer 310a is made of a material such as ITO, IZO or IO, and the third metal layer 250a is made of a material having a resistance value lower than the transparent conductive material layer such as Al, Al-alloy, Mo, Mo-alloy, Cr, or Ti.

The upper capacitor electrode 170 is formed at the same time as the source and drain electrodes 250 and 255. Like the source and drain electrodes 250 and 255, the upper capacitor electrode 170 also has a dual-layered structure. Portions of the transparent conductive material layer 310a and the third metal layers 310a and 250a over the pixel region 140 remains.

Figure 4E:
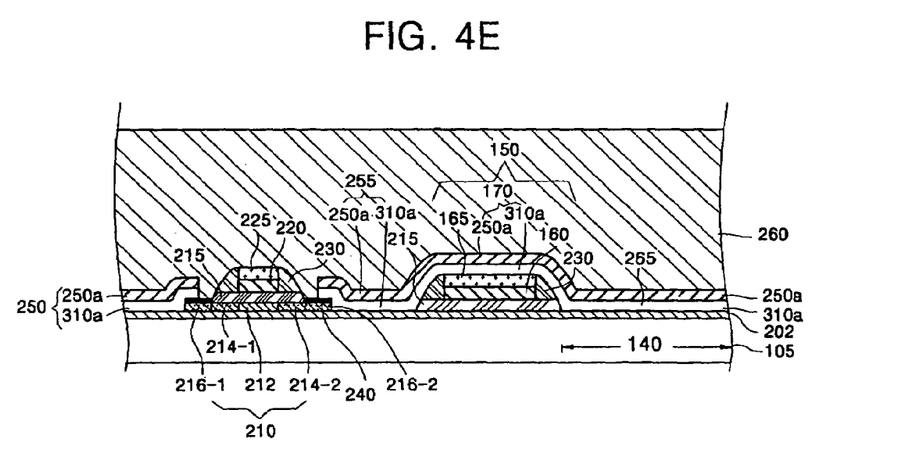

Subsequently, as shown in 4E, a fourth insulating layer 260 are deposited over the whole surface of the substrate 105. The fourth insulating layer 260 serves as a passivation layer and is made of an organic material such as acrylic or polyimide or an inorganic material such as an oxide layer or a nitride layer.

Figure 4F:
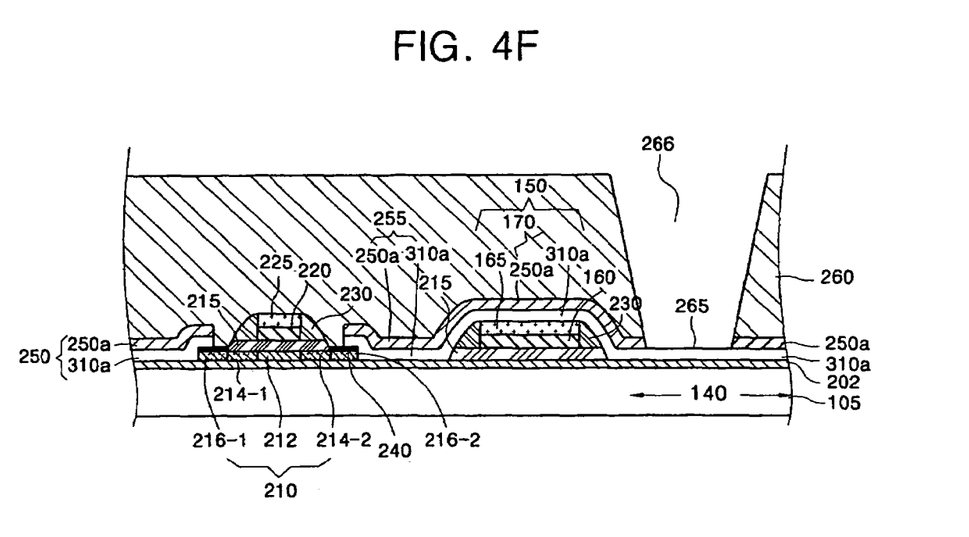
Figure 4G:
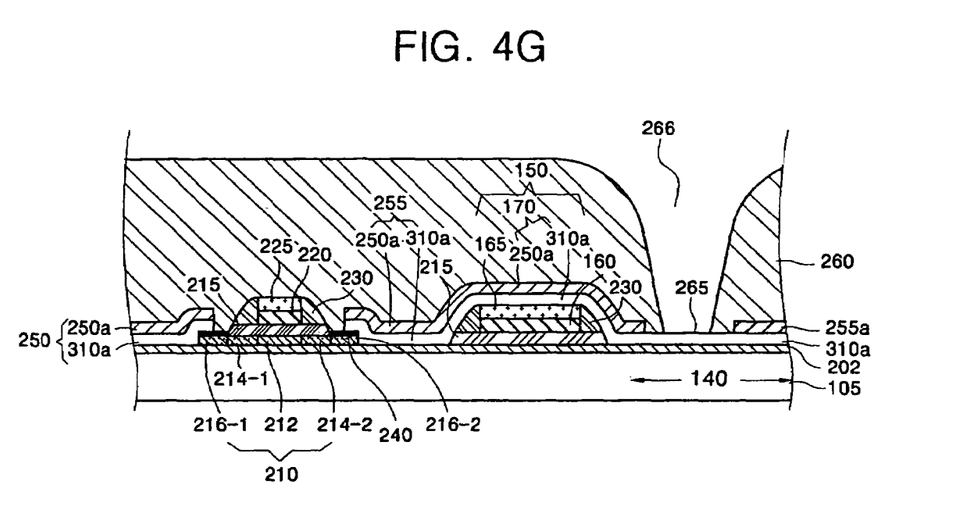

Next, as shown in FIG. 4F, a portion of the passivation layer 260 and a portion of the third metal layer 250a are etched to expose a portion of the transparent conductive material layer 310a over the pixel region 140, so that an opening portion 266 is formed. The exposed portion of the transparent conductive material layer 310a serves as a pixel electrode 265.

In manufacturing the active matrix display device according to the present invention, a manufacturing method according to the second preferred embodiment is used. However, other methods, for example, a manufacturing method according to the first preferred embodiment of the present invention can also be used.

Meanwhile, when the passivation layer is made of an organic material such as acrylic or polyimide, after a portion of the passivation layer 260 and a portion of the third metal layer 250a over the pixel region 140 are etched to form the opening portion 266, a reflow process can be carried out to cover and insulate end portions of the third metal layer 250a.

When such a manufacturing process is applied to the organic EL display, an organic EL layer that will be formed in subsequent process contacts only a portion of the transparent conductive material layer 310a which serves as the pixel electrode 265, therefore reliability can be improved. According to the one embodiment, the passivation layer is formed to cover the third metal layer 250a by using the reflow process, without additional masking process and therefore open failure in the organic EL layer is prevented.

Figure 5A:
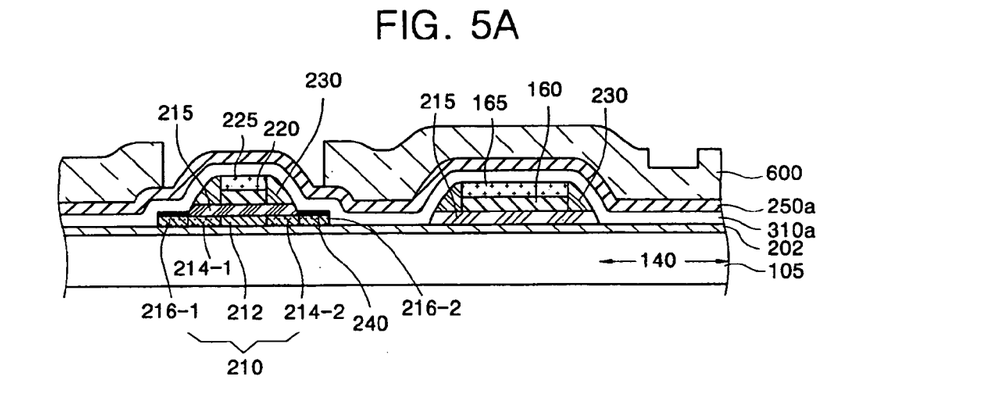
FIGS. 5A to 5C are cross-sectional views illustrating a process of manufacturing an active matrix flat panel display device according to another embodiment of the present invention.
Figure 5B:
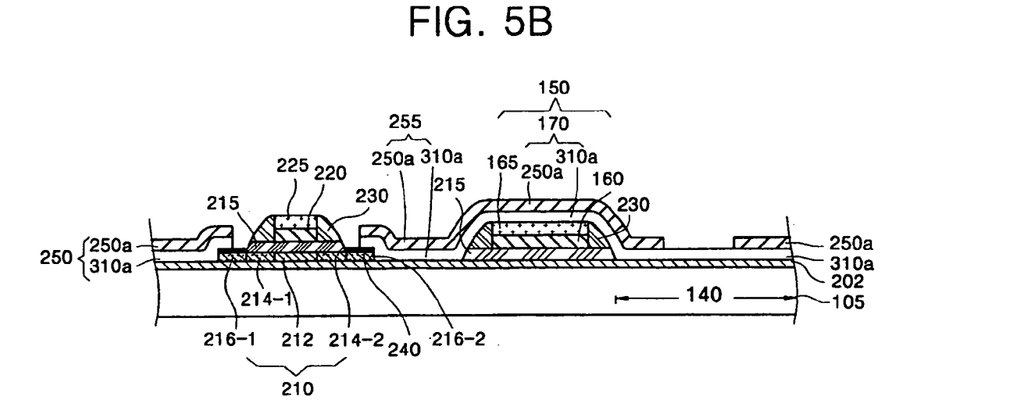
Figure 5C:
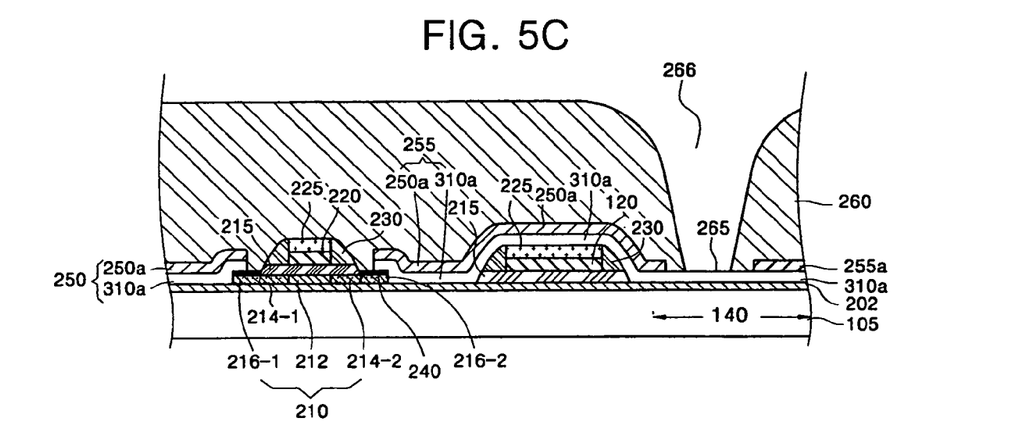

FIGS. 5A to 5C are cross-sectional views illustrating a process of manufacturing an active flat panel matrix display device according to another embodiment of the present invention.

FIG. 5A shows a manufacturing process subsequent to FIG. 4C. As shown in FIG. 5A, after the transparent conductive material layer 310a and the third metal layer 250a are sequentially deposited over the whole surface of the substrate 105, a photoresist layer is deposited to a predetermined thickness on the third metal layer 250a and patterned into a photoresist pattern 600 using a half-tone mask to expose a portion of the third metal layer 250a corresponding to the TFT. Also, a portion of the photoresist pattern 600 corresponding to the pixel region 140, i.e., a portion of the photoresist pattern 600 in which an opening portion will be formed, is formed to a relatively thin thickness. A thickness of the portion of the photoresist pattern 600 in which the opening portion will be formed depends on an etching process of the third metal layer 250a.

As shown in FIG. 5B, using the photoresist pattern 600 as a mask, the third metal layer 250a is etched to form source and drain electrodes 250 and 255, and at the same time, a portion of the third metal layer 250a in which the opening portion will be formed is removed. A portion of the transparent conductive material layer 310a corresponding to the pixel region 140 is exposed. Thereafter, the remaining portion of the photoresist pattern 600 is removed.

As shown in FIG. 5C, a planarization layer 260 is formed over the whole surface of the substrate 105. The planarization layer 260 includes the opening portion 266 on the exposed portion of the transparent conductive material layer 310a. At this time, the opening portion 266 is formed to perfectly surround the metal layer 250a, whereby an organic EL element is formed only on the transparent conductive material layer 310a in subsequent process. Therefore, the active matrix display device according to another embodiment of the present invention is completed.

According to another embodiment, the passivation layer is formed to cover the third metal layer 250a by using the half-tone mask, without additional masking process and therefore open failure in the organic EL layer is prevented. The passivation layer is made of an organic material such as acrylic or polyimide or of an inorganic material such as silicon oxide or silicon nitride.

As described herein before, the TFT and the active matrix display device according to the preferred embodiments of the present invention have the following advantages.

The source and drain electrodes of the TFT can have a dual-layered structure without any additional process. When the active matrix display device is manufactured using the TFT having the dual-layered source and drain electrodes, four mask processes are performed, whereupon a manufacturing process is simplified, leading to high manufacturing yield and low production cost.

Also, since the capping layer is formed on the gate electrode of the TFT, while an ion-implanting process is performed to form the low-density source and drain regions, it is prevented that the gate electrode is damaged.

In addition, due to the silicide layers respectively formed between the source and drain regions and the source and drain electrodes, a contact resistance is reduced, leading to high reliability. Further, since the source and drain electrodes directly contact the source and drain regions without contact holes, a manufacturing process is simplified.

Further more, since an LDD region or an off-set region is formed in a self-align manner through the spacers formed both side wall portion of the gate electrode or the anodizing layer surrounding the gate electrode, a manufacturing process is simplified, and electric characteristics such as an on/off current ratio is improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An active matrix display device, comprising: an insulation substrate;
   a thin film transistor formed on the insulation substrate, including a semiconductor layer where source/drain regions are formed, gate electrode and source/drain electrodes respectively connected to the source/drain regions;
   an insulation film formed over the insulation substrate, having an opening portion; and
   a pixel electrode as a lower electrode,
   wherein the source/drain electrodes have a dual-layered structure of a transparent conductive layer and a metal layer, the metal layer being enclosed by the insulation film and formed on the transparent layer, wherein the metal layer and the insulation film are etched for exposing a portion of the transparent conductive layer forming any one of the source/drain electrodes, and wherein the pixel electrode extends from the portion of the transparent conductive layer forming any one of the source/drain electrodes and is exposed through the opening portion of the insulation film.

2. The active matrix display device according to claim 1, wherein the insulation film is a passivation layer patterned to cover the metal layer of the source/drain electrodes.

3. The active matrix display device according to claim 1, wherein the insulation film is a passivation layer reflowed to enclose the metal layer of the source/drain electrodes.

4. The active matrix display device according to claim 1, further comprising an organic EL layer formed on a portion of the pixel electrode exposed through the opening portion, wherein the organic EL layer is insulated from the metal layer of the source/drain electrodes.

* * * * *